United States Patent
Lee

(10) Patent No.: US 7,193,686 B2
(45) Date of Patent: Mar. 20, 2007

(54) LITHOGRAPHY APPARATUS AND METHOD FOR MEASURING ALIGNMENT MARK

(75) Inventor: Il Ho Lee, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 43 days.

(21) Appl. No.: 11/024,743

(22) Filed: Dec. 30, 2004

(65) Prior Publication Data
US 2005/0286036 A1 Dec. 29, 2005

(30) Foreign Application Priority Data
Jun. 23, 2004 (KR) ............... 10-2004-0046897

(51) Int. Cl.
G03B 27/72 (2006.01)
G03B 27/42 (2006.01)
G03B 27/52 (2006.01)

(52) U.S. Cl. ............... 355/69; 355/53; 355/55
(58) Field of Classification Search .......... 355/52, 355/53, 55, 67, 69; 250/548; 356/399–401
See application file for complete search history.

(56) References Cited

U.S. PATENT DOCUMENTS

| | | | | |
|---|---|---|---|---|
| 5,936,253 A | * | 8/1999 | Sugaya | 250/548 |
| 6,151,121 A | * | 11/2000 | Mishima | 356/399 |
| 6,219,130 B1 | * | 4/2001 | Kawakubo | 355/67 |
| 6,304,319 B1 | * | 10/2001 | Mizutani | 355/69 |

* cited by examiner

*Primary Examiner*—Henry Hung Nguyen
(74) *Attorney, Agent, or Firm*—Mayer Brown Rowe & Maw LLP

(57) ABSTRACT

A lithographic exposing system having an optical system including a light source, a lens, a mirror and a filter, and transferring patterns formed on a reticle to a substrate. The method includes a device for lowering the energy of the light from the light source below a threshold energy, an equipment for making the light that has passed through the device a light source for measuring alignment marks formed on the substrate, and a light path controlling device for directing the light from the light source toward the optical system in an exposing process and for making the light from the light source toward said the alignment mark measuring equipment.

5 Claims, 3 Drawing Sheets

LITHOGRAPHY APPARATUS AND METHOD FOR MEASURING ALIGNMENT MARK

BACKGROUND OF THE INVENTION

1. Field of the Invention

The present invention relates to a lithography technology, and more specifically, to a lithography apparatus and a method for measuring alignment marks.

2. Description of the Related Art

Semiconductor device manufacturing technology has grown rapidly with the development of recent information and computer technologies. The semiconductor IC devices are developed with a goal of higher integration, greater miniaturization and higher speed, and thus the needed specifications for micro-fabrication technology, such as lithography techniques for improving the integrity of the IC devices, has become severe.

The lithography technology is a photo technology that transfers patterns of geometric shapes in a mask (better known as reticle) to a layer of radiation-sensitive material (i.e., photoresist material) covering the surface of a semiconductor wafer. The lithography process includes deposition of the photoresist material, a soft-baking step, an alignment and exposure step, a Post Exposure Bake (PEB) step and a development step.

Apparatuses for the exposure include a stepper and a scanner. The stepper widely used since 1990s exposes a single shot and moves the wafer by one shot along X and Y axes for the subsequent exposure. The stepper, which usually defines a shot area with a mask size of 5 to 6 inches has good uniformity, and light passing through a projection lens exposes the surface of wafer with reduced size of ⅕. The scanner is broadly employed these days because it can further improve the uniformity by exposing with slits within a field and implement large scale field. In such a scanner, the mask size is normally 6 inches and ¼ reduction exposure is performed.

Photoresist materials have resistance to etching of lower layers and are sensitive to radiation, which alters their chemical properties sufficiently so that a pattern can be delineated in them. The photoresist is divided into two: a positive photoresist and a negative photoresist. After irradiation, the positive photoresist in the exposed pattern area absorbs energy, changes its chemical structure, and transforms into a more soluble species. Upon developing, the exposed areas are expunged. In high integration semiconductor fabrication processes, the positive photoresist is used because of its strong etch resistance and high resolution properties. Whilst, the negative photoresist are polymers combined with a photosensitive compound. Following exposure, the photosensitive compound absorbs the radiation energy and converts it into chemical energy to initiate a chain reaction, thereby causing crosslinking of the polymer molecules. The cross-linked polymer has a higher molecular weight and becomes insoluble in the developer solution. After development, the unexposed portions are removed.

One of parameters that determine the performance of a lithographic exposure is registration, which is a measure of how accurately patterns on successive masks can be aligned or overlaid with respect to previously defined patterns on the same wafer. The exposure equipment has to align the mask and wafer before exposing. For the alignment, the equipment drives a stage on which a semiconductor wafer is placed along X-axis, Y-axis and θ-axis (rotation axis) to carry out correction operation, and performs the exposure.

The alignment mark refers to labels or marks formed in a predetermined region of the wafer for the alignment of the mask and wafer.

Overlay accuracy is a measure of aligning one layer of a process stack to the subsequent layer, and affected by errors that may occur during the process or from errors in mask or equipment. Typically, patterns for measuring the overlay and alignment marks are formed within the scribe lane of a semiconductor wafer.

The alignment mark lies below the photoresist layer and hence a light source different from the exposure light is used for the alignment mark for preventing the exposure of the photoresist material.

FIG. 1 shows the construction of related art equipment for measuring the alignment mark.

Referring to FIG. 1, light from a light source 100 such as He—Ne laser reflects from or passes through reflection plate 101, optical fiber 102 and lens 103, propagates through a photoresist 140 on a semiconductor wafer or substrate 120, and is reflected backwards from alignment marks 130. The reflected light again passes through the lens 103, and is reflected by a reflection plate 104 to be incident to a CCD (Charge Coupled Device) camera 105. The CCD camera detects and acquires signals of the alignment marks by the use of the light reflected from the substrate.

As explained, the related art equipment for measuring the alignment mark employs a separate light source of He—Ne laser for the alignment mark measurement, which makes the exposure equipment complex and causes an increase of the equipment cost. Moreover, replacing time and cost for the additional light source are inevitable.

Dispersion of light can bring into play the dependence of refraction on the wavelength of light. The He—Ne laser has a wavelength of 633 nm, which is different from the exposing wavelength (for instance g-line of 436 nm, i-line of 365 nm, DUV (Deep Ultra-Violet) of 248 nm or 193 nm) and therefore the refraction becomes different in the exposure process than in the alignment mark measuring process. This difference of refraction may lead to correction errors and result in overlay errors and failure of pattern transfer.

SUMMARY OF THE INVENTION

It is, therefore, an object of the present invention to minimize the measurement error caused from the difference between the alignment mark measuring wavelength and the exposing wavelength.

Another object of the present invention is to improve the alignment performance and the overlay accuracy.

It is still another object of the present invention to simplify exposure equipment.

Accordingly, the present invention advantageously provides an exposing system having an optical system including of a light source, one or more lens, a mirror and a filter, and transferring patterns formed on a reticle to a substrate. The system includes an energy adjustment device for lowering the energy of the light from the light source below a threshold energy, an alignment mark measuring equipment for making the light that has passed through the energy adjustment device to be a light source for measuring alignment marks formed on the substrate, and a light path controlling device for controlling the light from the light source toward the optical system in exposing process and for controlling the light from the light source toward the alignment mark measuring equipment.

According to another aspect of the present invention, a method for measuring alignment marks is provided that includes the steps of extracting a measuring light source having identical wavelength as wavelength in exposing process from a light source, which constitutes a exposing equipment, lowering the energy of the measuring light source below a threshold energy, and measuring the alignment marks with the measuring light source, which has lower energy than the threshold energy.

These and other aspects will become evident by reference to the description of the invention.

BRIEF DESCRIPTION OF DRAWINGS

A more complete appreciation of the invention and many of the attendant advantages thereof will become readily apparent with reference to the following detailed description, particularly when considered in conjunction with the accompanying drawings, in which.

DETAILED DESCRIPTION OF THE INVENTION

Figure 1:
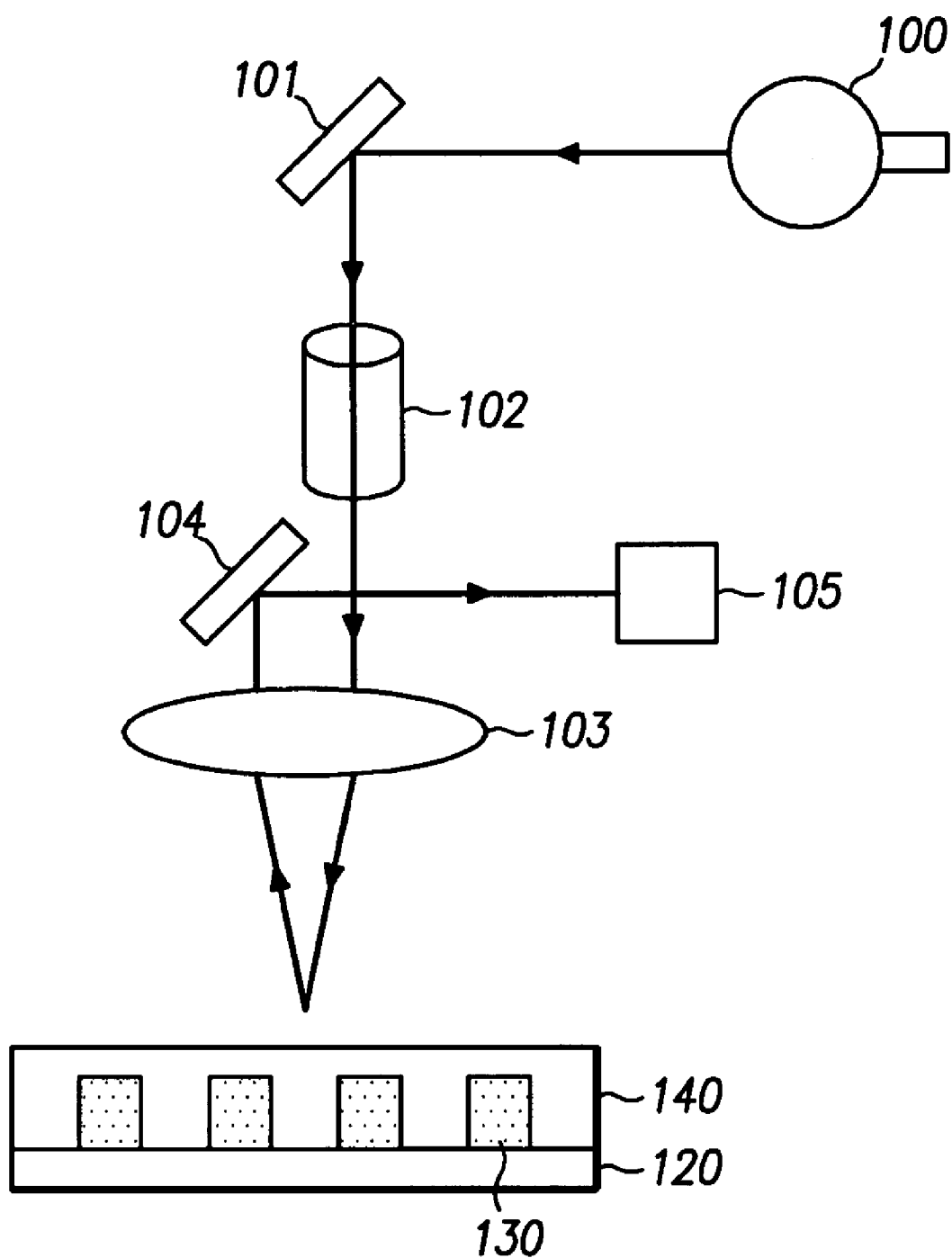
FIG. 1 is a schematic diagram of related art alignment mark measuring equipment.
Figure 2:
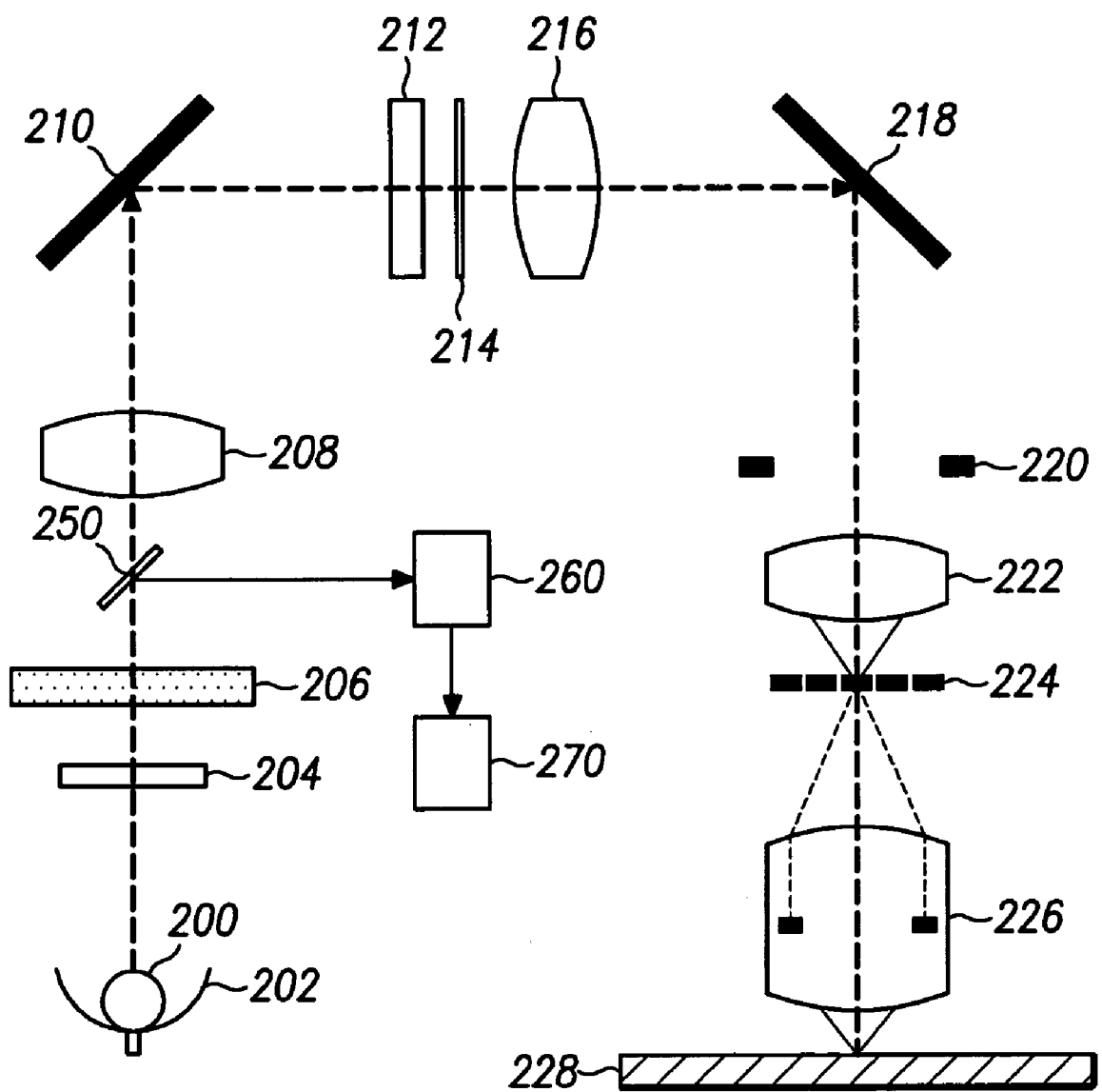
FIG. 2 is a schematic diagram of an exposure equipment of the present invention.

FIG. 2 shows the construction of the exposure equipment of the present invention.

Light emanated from a light source 200 is reflected by an elliptic mirror 202 and passes through a shutter 204. The shutter 204 blocks the light during non-exposing time and has to be exchanged after it is used for a sufficient time since the outworn shutter may be damaged. The light source employs conventional sources such as a mercury lamp and an eximer laser. The optical system of FIG. 2 uses an ultraviolet. If the system is a DUV system that employs the eximer laser, a shutter is not needed and light is not emitted by no generation of the laser pulses during non-exposing time. The light of multiple wavelengths passing through the shutter 204 propagates through a selection filter 206 that is based on the prism principle, and a light having an intended wavelength remains. For instance, the light passing through the selection filter is g-line having a wavelength of 436 nm or i-line having a wavelength of 365 nm. The selection filter 206 typically uses a colored quartz.

In an exposing process, a light path controlling device 250 changes the direction of light to an optical system for the pattern transfer. The light propagating through a first condense lens 208, a first mirror 210, a fly's eye lens 212, a light collecting sensor 214, a second condense lens 216, a second mirror 218, a reticle blind 220 and a collimator lens 222 passes through a reticle 224 and a projection lens 226 to form a pattern corresponding to shape formed in the reticle 224.

For the measurement of the alignment marks, the light path controlling device 250 changes the light toward the alignment measuring system, and the light passes through an energy adjustment device 260 to enter an alignment mark measuring equipment 270. The energy adjustment device 260 lowers the light energy below a threshold energy, which is the minimum energy capable of removing the photoresist, and prevents the photoresist from altering its chemical properties by the alignment mark measuring light.

The structure of the exposure equipment of FIG. 2 is exemplary, and the present invention is not limited to the specific structure of FIG. 2. For example, the present invention can be applied to any exposure system having different structures varying from the manufacturers and having different exposing mechanism such as aligners, steppers and scanners. Further, the location of the light path controlling device 250 is not limited to the arrangement shown in FIG. 2. Moreover, the energy adjustment device 260 may be attached to the alignment mark measuring equipment 270 or a built-in system within the alignment mark measuring equipment 270. In case of the built-in system, the device 260 controls the measuring light source after it has passed through a predetermined optical system within the alignment mark measuring equipment 270.

Figure 3:
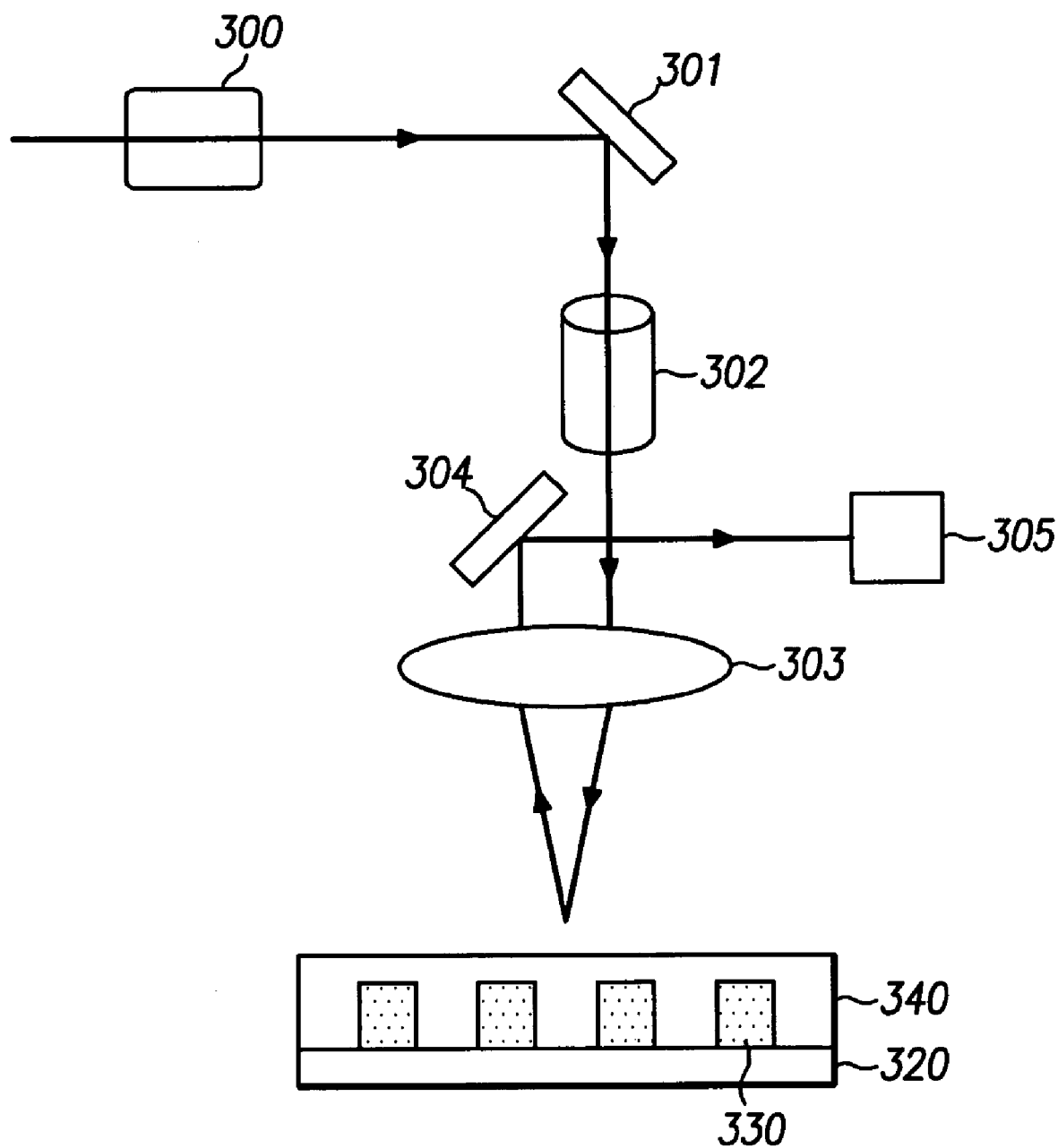
FIG. 3 is a schematic diagram of an alignment mark measuring equipment of the present invention.

FIG. 3 shows the structure of the alignment mark measuring equipment of the present invention.

Referring to FIG. 3, light through the energy adjustment device 260 is collected by the light collecting means 300 and reflects from or passes through a reflection plate 301, an optical fiber 302 and lens 303 to be reflected by alignment marks 330 lying under a photoresist layer 340 on a substrate 320. The reflected light propagates backward through lens 303 and is reflected again by the reflection plate 304 to enter an image device 305 (e.g., a CCD camera). The image device 305 detects the alignment marks and acquires necessary signals from the light reflected from the substrate 320. The signals obtained by the image device 305 is crucial in the subsequent process i.e., in aligning the substrate. It is preferable that the light employed in measuring the alignment marks 330 has the same wavelength as the exposing light of, for instance, g-line of 436 nm, i-line of 365 nm, or DUV of 248 nm or 193 nm so that the measuring errors, which may occur from a difference between the alignment measuring wavelength and the exposing wavelength are minimized and the performance of the alignment, overlay accuracy and yield of semiconductor devices can be significantly improved. Further, the present invention does not need to employ additional light source for the alignment mark measurement and thus more simple exposing equipment can be provided, and time and cost for the replacing the conventional measuring light source are not needed.

The alignment marks 330 may be line and space patterns, hole patterns, or box-in-bar patterns and takes the role of overlay marks. Further, embossed marks and intaglio marks can be used as the alignment marks 330.

Korean Patent Application No. 2004-46897, filed on Jun. 23, 2004, is hereby incorporated by reference in its entirety.

The structure of the exposure equipment of FIG. 3 is exemplary, and the present invention is not limited to the specific arrangement of components shown in FIG. 3. Therefore, any optical systems and optical measuring techniques varying from the manufacturers can be applied to the present invention without departing the spirit and scope of the present invention as defined by the appended claims.

What is claimed is:

1. An exposing apparatus having an optical system including a light source, one or more lens, a mirror and a filter, and transferring patterns formed on a reticle to a substrate, said apparatus comprising:
   an energy adjustment device configured to lower an energy of a light from the light source below a threshold energy;
   an alignment mark measuring equipment configured to use the light that passes through the energy adjustment device as a light source for measuring alignment marks formed on the substrate; and
   a light path controlling device configured to direct the light from the light source toward said optical system during an exposing process and toward said alignment mark measuring equipment during measurement of the alignment marks.

2. The exposing apparatus of claim 1, further comprising a selection filter configured to extract from the light a specific wavelength for exposing or measuring.

3. The exposing apparatus of claim 1, wherein said alignment mark measuring equipment includes:
   means for collecting light;
   an optical system configured to control light passing through the light collecting means; and
   an imaging device configured to detect the alignment marks by using light reflected from the substrate after the light passes through the optical system and emanates to the substrate.

4. A method for measuring alignment marks, comprising the steps of:
   extracting a measuring light from a light source of an exposing equipment, the measuring light having a wavelength identical to a wavelength of light from the light source used in an exposing process;
   lowering the energy of the measuring light below a threshold energy; and
   measuring alignment marks with the measuring light, which has lower energy than the threshold energy.

5. The method of claim 4, wherein the wavelength of the measuring light is one selected from a group consisting of g-line of 436 nm, i-line of 365 nm, 248 nm and 193 nm.

* * * * *